(12) United States Patent
Legros et al.

(10) Patent No.: US 9,366,698 B2
(45) Date of Patent: Jun. 14, 2016

(54) CLAMP INCLUDING FIXED AND MOVABLE JAWS FOR MEASURING A GROUND LOOP CURRENT

(71) Applicant: CHAUVIN ARNOUX, Paris (FR)

(72) Inventors: Philippe Legros, Paris (FR); Thierry Rouillard, Paris (FR)

(73) Assignee: CHAUVIN ARNOUX, Paris (FR)

( * ) Notice: Subject to any disclaimer, the term of this patent is extended or adjusted under 35 U.S.C. 154(b) by 246 days.

(21) Appl. No.: 14/157,655

(22) Filed: Jan. 17, 2014

(65) Prior Publication Data

US 2014/0203799 A1     Jul. 24, 2014

(30) Foreign Application Priority Data

Jan. 18, 2013  (FR) ..................................... 13 50458

(51) Int. Cl.
| | | |
|---|---|---|
| *G01R 1/22* | (2006.01) | |
| *G01R 33/00* | (2006.01) | |
| *G01R 15/18* | (2006.01) | |
| *G01R 1/20* | (2006.01) | |
| *G01R 31/02* | (2006.01) | |

(52) U.S. Cl.
CPC .. *G01R 1/20* (2013.01); *G01R 1/22* (2013.01); *G01R 31/024* (2013.01); *G01R 15/186* (2013.01)

(58) Field of Classification Search
CPC ........... G01R 33/00; G01R 1/22; G01R 15/18

USPC .......................... 324/126–127, 129, 149, 117
See application file for complete search history.

(56) References Cited

U.S. PATENT DOCUMENTS

| | | | |
|---|---|---|---|
| 2,842,739 A | | 7/1958 | Lamb |
| 3,611,136 A | * | 10/1971 | Ito ........................... H01F 38/30 |
| | | | 324/127 |
| 4,518,913 A | | 5/1985 | Jackson |
| 5,039,970 A | * | 8/1991 | Cox ......................... G01R 1/22 |
| | | | 336/107 |

FOREIGN PATENT DOCUMENTS

| | | |
|---|---|---|
| EP | 0 836 099 A1 | 4/1998 |
| FR | 2 562 316 A1 | 10/1985 |

OTHER PUBLICATIONS

French Patent Office; Search Report in French Patent Application No. 13 50 458 Nov. 11, 2013.

* cited by examiner

*Primary Examiner* — Tung X Nguyen
*Assistant Examiner* — Neel Shah
(74) *Attorney, Agent, or Firm* — Leydig, Voit & Mayer, Ltd.

(57) ABSTRACT

A clamp for measuring a ground loop current includes a first jaw secured to a fixed support and a second jaw pivotally mounted on the fixed support, and pivotable between a position closing the clamp and an open position, and an elastic element for returning the movable jaw to the closed position. The clamp includes a device scaling down the force required for opening the clamp, by application of the force to a trigger. The device is mounted between the elastic return element and the trigger, upon opening the clamp.

10 Claims, 4 Drawing Sheets

CLAMP INCLUDING FIXED AND MOVABLE JAWS FOR MEASURING A GROUND LOOP CURRENT

FIELD OF THE INVENTION

The invention relates to a clamp for measurement of a ground loop of the type comprising a jaw secured to a fixed support and a jaw pivotally mounted on the support, between a closure position of the clamp in which the end of the movable jaw is in pressed contact with the end of the fixed jaw and an opening position of the clamp, and an elastic return element of the movable jaw in its closure position, the movable jaw being formed by an arm of a lever with two arms, the other arm which forms the trigger for causing pivoting of the lever.

BACKGROUND

Ground loop measurement clamps of this type are already known. The general problem of these clamps is to have a pressure as large as possible for closing both of these clamps on each other in order to minimize the air gap between the contact faces of both jaws. In order to attain this goal, the clamps are designed so as to require a very large force for opening the jaws, which is very bothersome for the user. This force is located around 60 Newtons upon starting the opening and reaches 140 Newtons when maintaining the clamp in the completely open condition. Indeed, the more the clamp is opened, the more the force increases.

SUMMARY OF THE INVENTION

The object of the invention is to overcome this drawback.

In order to achieve this object, the clamp according to the invention is characterized in that it comprises a device for scaling down the force for opening the clamp, by its application on the trigger, which is mounted between the return elastic element and the trigger, and adapted for reducing the opening force during the opening.

According to a feature of the invention, the scaling-down device comprises an arrangement of connecting rods, which is mounted between the movable end of the elastic element, the other end of which is connected to a joint axis fixedly mounted on the support, and the arm bearing the movable jaw (4) of the two-arm. According to another feature of the invention, the scaling-down device is adapted for reducing during pivoting of the clamp in its open position, the moment around the pivot axis of the lever, produced by the force opposing the opening of the clamp, under the effect of the return spring.

According to still another feature of the invention, the scaling-down device is adapted for reducing during pivoting of the clamp in its open position, the length of the arm of the moment of the opposing force around the pivot axis of the two-arm lever.

According to still another feature of the invention, the clamp comprises two connecting rods, one of which is interposed between the arm bearing the movable jaw and a joint axis at the movable end of the return element and a connecting rod which is interposed between the joint axis and the fixed joint axis so as to force, during the opening of the clamp, the axis to move on a circular arc around the fixed joint, that the force opposing the opening depends on the return force of the return element and on the ratio of the length of the arm of the moment produced by the return force around the fixed joint axis and on the length of the arm around the fixed axis of the moment of the opposing force, and in that the ratio of both arms decreases upon opening the clamp by the displacement of the movable joint axis on the circular arc.

According to still another feature of the invention, the moment of the application force around the pivot axis of the lever is equal to the moment of the opposing force around the axis.

According to still another feature of the invention, the arm of the moment of the opposing force around the pivot axis of the two-arm lever decreases during pivoting of the lever in the open position of the clamp.

According to another feature of the invention, the elastic element is a traction spring.

BRIEF DESCRIPTION OF DRAWING FIGURES

The invention will be better understood, and other objects, features, details and advantages thereof will become more clearly apparent in the explanatory description which follows, made with reference to the appended drawings only given as an example illustrating an embodiment of the invention and wherein.

DETAILED DESCRIPTION

Figure 1:
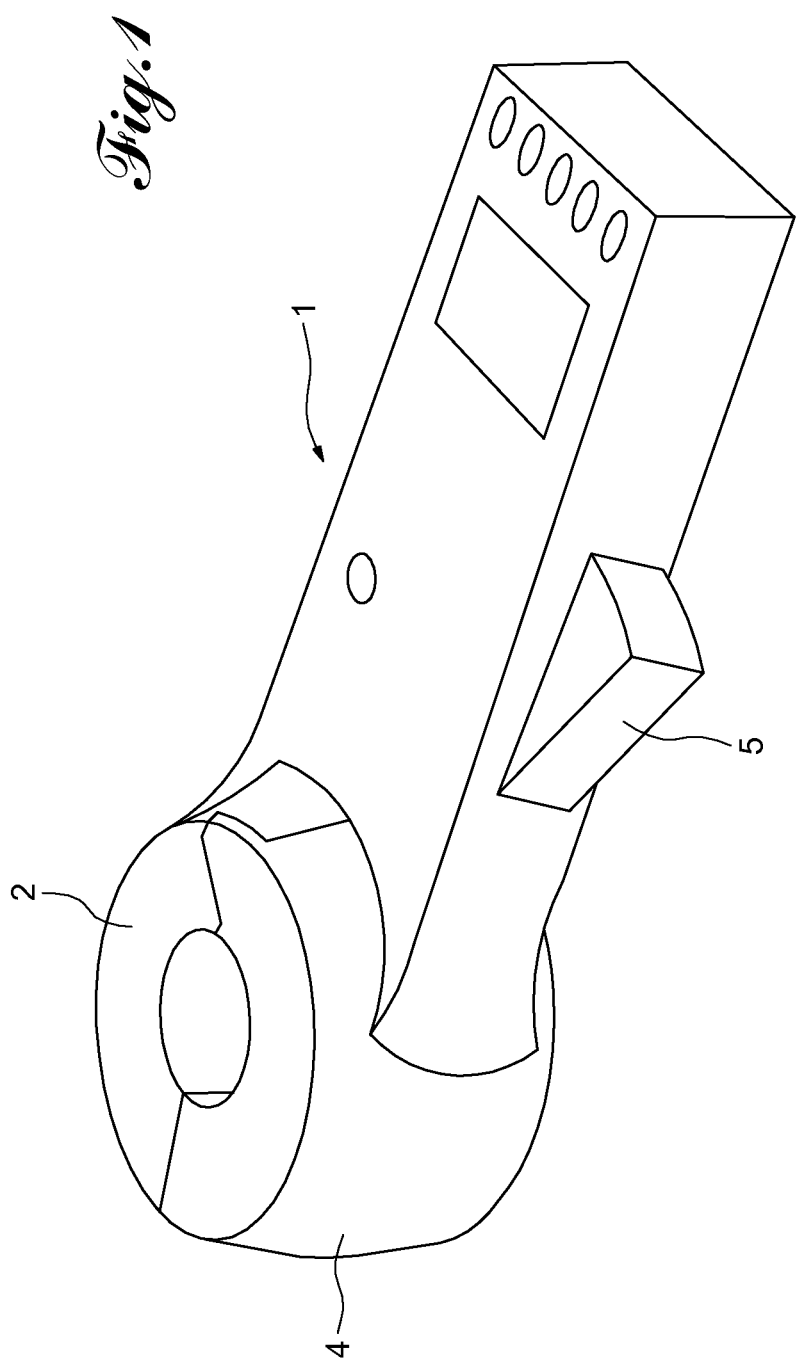
FIG. 1 is a perspective view of a ground loop measurement clamp of the type of the clamp according to the invention.
Figure 2:
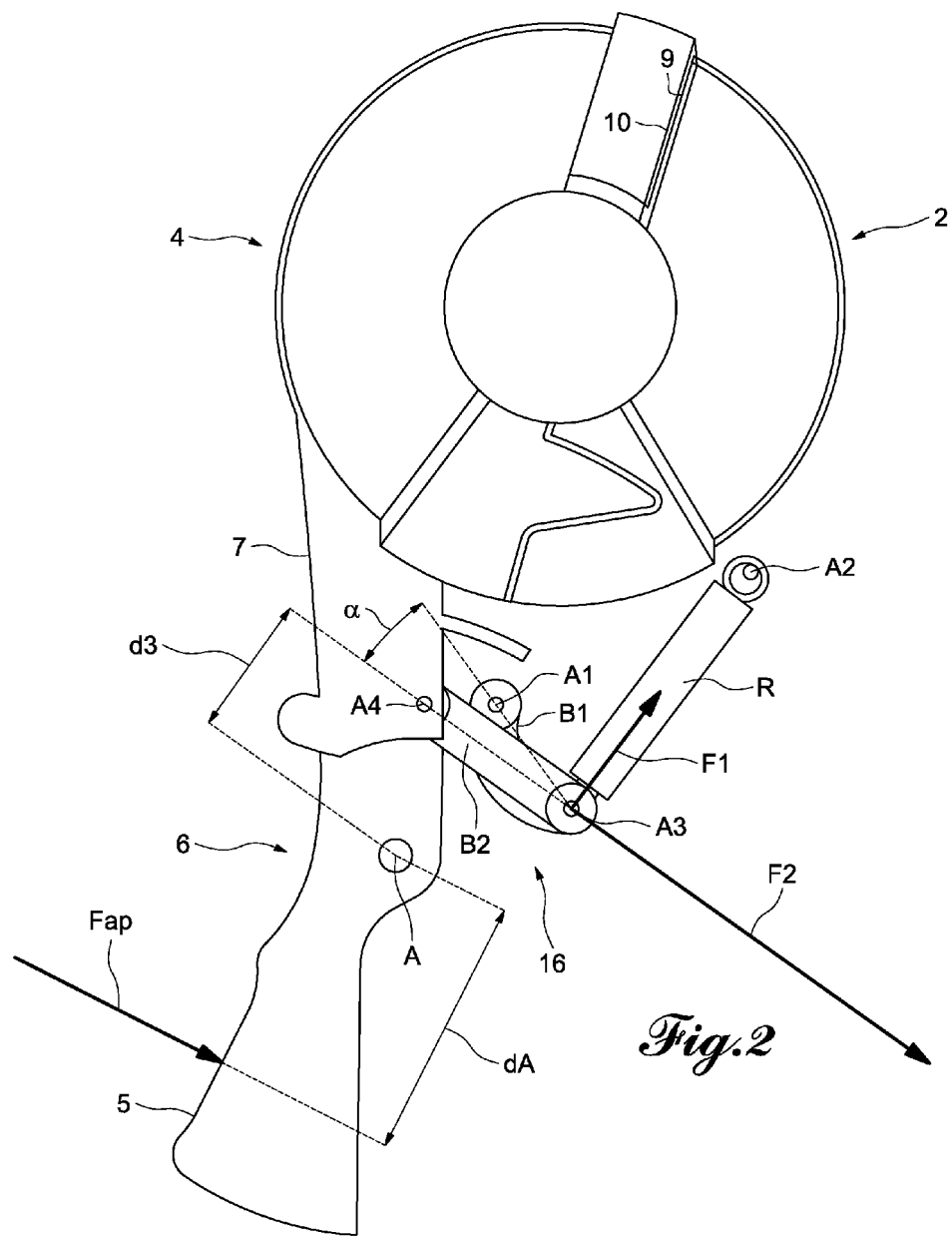
FIG. 2 is a schematic view of a ground loop measurement clamp according to the invention, showing this clamp in its closure position.
Figure 3:
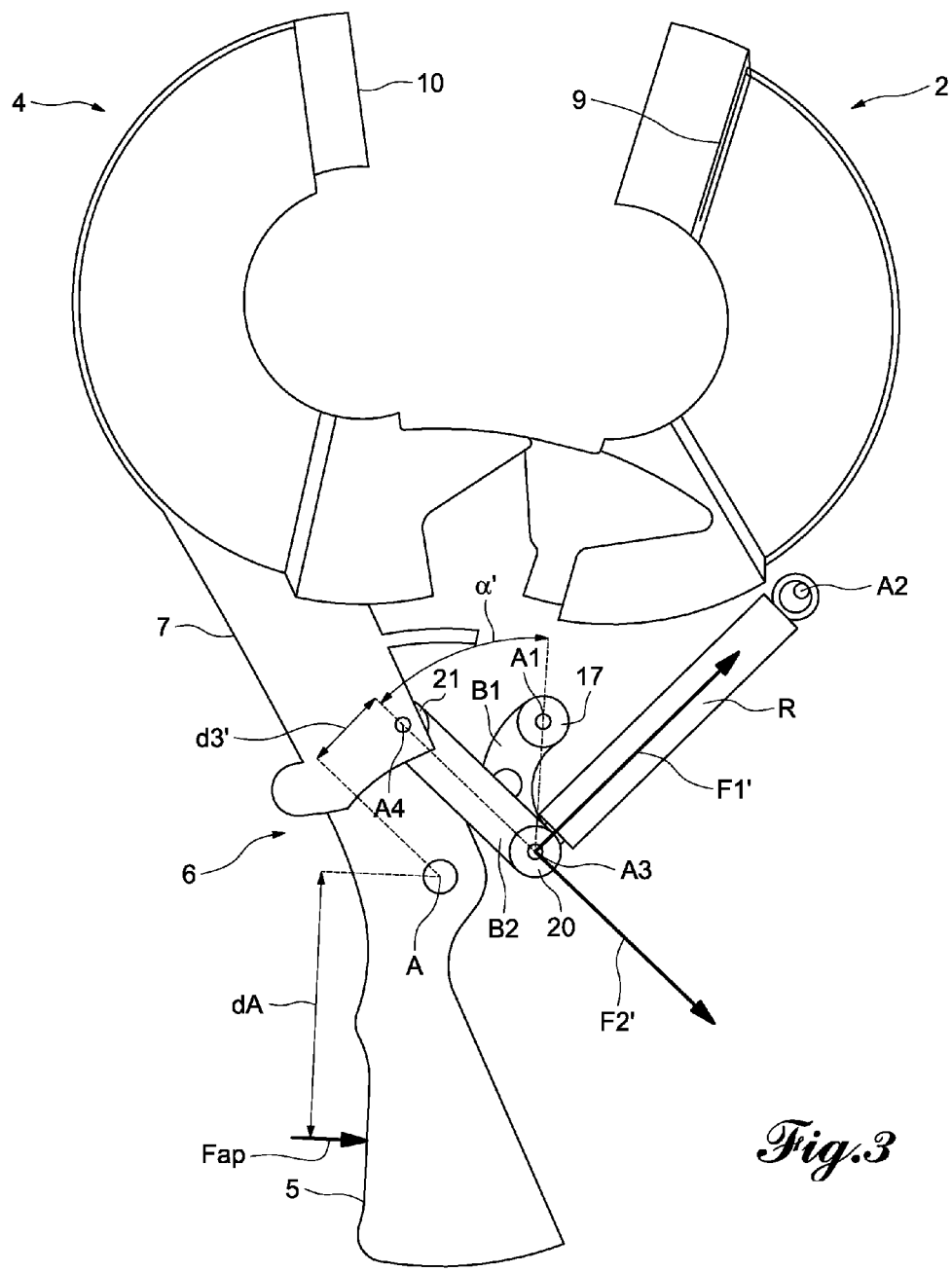
FIG. 3 shows the clamp according to FIG. 2 in its open position.

As shown in FIG. 1, a ground loop measurement clamp comprises a portion forming a casing 1, to which is secured a portion 2 of forming the fixed jaw of the clamp and a movable jaw 4 between the closed position of the clamp illustrated in FIGS. 1 and 2 and an open position according to FIG. 3, the movement of which is controlled by a member forming a trigger 5 which the user pushes into the casing 1 for opening the clamp.

Referring to FIGS. 2 and 3, it is seen that the trigger 5 forms an arm 5 of a two-arm lever 6, which is pivotally mounted around an axis A. This axis is mounted on a fixed support of the casing. The movable jaw 4 is borne by the second arm 7 of the lever 6.

FIGS. 2 and 3 show that the jaws 2 and 4 have the shape of circular arcs. In their position for closing the clamp, the end front faces 9, 10 of the jaws 2 and 4 are in pressed contact over the whole of the surface.

The mechanism for controlling the opening and the closing of the clamp essentially comprises a spring R and a device 16 formed and arranged so as to ensure scaling down of the forces for opening and closing the clamp 1. The spring R is connected through one end to a fixed joint axis A2, i.e. fixedly mounted on a support of the casing.

The scaling-down device 16 comprises, in the illustrated example, a first curved connecting rod B1 which is connected through one end 17 to a fixed axis of rotation A1, while its other end 18 is used as a movable joint axis A3 bound to the spring R and to an end 20 of a second connecting rod B2 of the scaling-down device. The other end 21 of the connecting rod B2 which is a rectilinear connecting rod is connected to the joint axis A4 provided on the arm 7 of the lever 6 which rotates around the fixed axis A and the other arm of which forms the control trigger 5. The spring R, a helical spring, is oriented substantially rectangularly to the arm B2 when the clamp is closed. It is actuated in traction during the opening of the clamp.

The operation of the scaling-down device will become apparent from the description of the clamp according to the invention which will be given hereafter.

When the user wishes to open the clamp by bringing it from its closure position of FIG. 2 to the opening position according to FIG. 3, he applies a pressure force Fap on the trigger 5 which rotates the lever 6 in the direction D1 around the fixed axis A, which causes displacement of the axis A4 on the arm 7 of the lever in the direction of the arrow D2. The rectilinear connecting rod B2 which is jointed to the axis A4 causes displacement of the axis A3 to which is jointed the spring R. But, the curved connecting rod B1 forces displacement of the axis A3 on a circular arc around the fixed axis A1.

Figure 4:
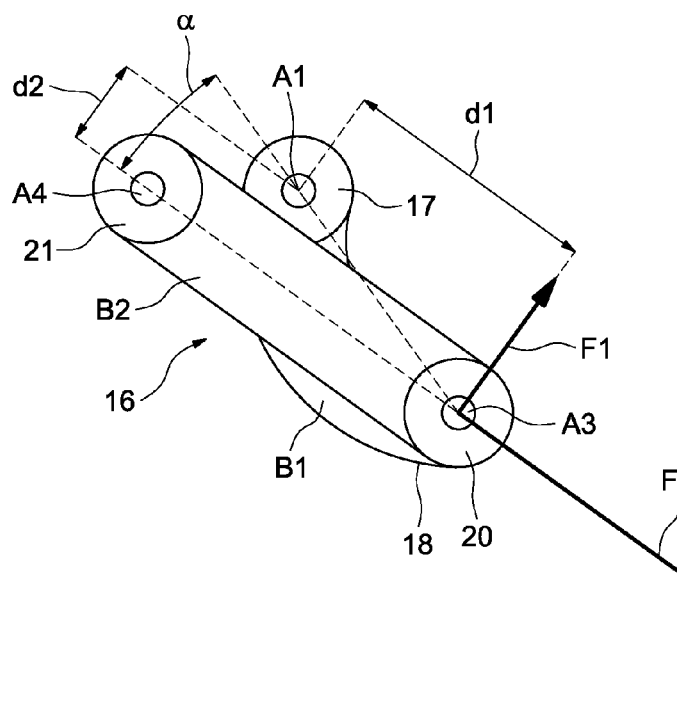
FIGS. 4 and 5 are explanatory schematic views of the operation of the connecting rod device according to the invention, showing this device when the clamp is closed and open respectively.
Figure 5:
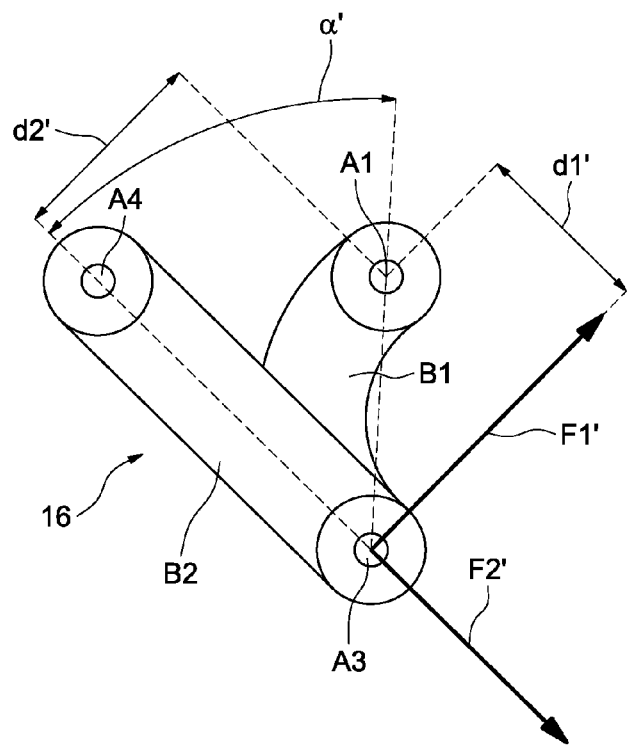

FIGS. 4 and 5 explain the scaling-down effect produced by the scaling-down device 16. FIG. 4 shows this device formed by the two connecting rods B1 and B2 in the condition when the clamp is closed. The spring R, in this position of the device, exerts a force $F_1$ on the axis A3, which generates a moment around the fixed axis A1 which is equal to the force $F_1$ multiplied by the torque arm d1. The spring also generates, due to the connecting rods B1 and B2, a force $F_2$ which acts in the direction of the rectilinear connecting rod B2. This force causes occurrence of a moment $M_2$ which is equal to the product of this force $F_2$ and of the arm d2, also around the fixed axis A1.

Given that the axis A1 is stationary, both moments should be equal. The relationships result therefrom:

$$M_{F1} = M_{F2}$$

$$F_1 \times d1 = F_2 \times d2$$

When the clamp is in its open position, illustrated in FIG. 3, with the device 16 according to FIG. 5, both moments act in the same way as in the closed position of the clamp, but the lengths of the arms d1 and d2 have changed and have become d1' and d2'. The return force of the spring has become the force $F_1$' and the force $F_2$ the force $F_2$'. But as before, it is possible to write:

$$F_1' \times d1' = F_2' \times d2'$$

The forces $F_2$ and $F_2$' opposing the opening of the clamp in the closed and open conditions respectively, may be determined by the following equations:

$$F_2 = \frac{F_1 \times d_1}{d_2};$$

$$F_2' = \frac{F_1' \times d_1'}{d_2'}$$

It is seen that the forces $F_2$ and $F_2$' depend on the force $F_1$, $F_1$' of the spring R and on the ratio of the length of the arms $$\frac{d_1}{d_2} \text{ and } \frac{d_1'}{d_2'}$$

of the moments.

The particularity of the invention notably lies in the discovery that by modifying the ratio of the arms of the moments during the opening of the clamp, the force opposing the opening may be caused to no longer essentially depend on the return spring R.

With reference to FIGS. 4 and 5, it is seen that the arm d2 is twice or thrice shorter than the arm d1, while in the open condition of the clamp, the arm d1' is shorter than the arm d2' which has the consequence that the force $F_2$ for maintaining the clamp in the open condition is clearly smaller than the force $F_2$ for opening the clamp.

As regards the moments exerted by the forces $F_2$ and $F_2$' around the axis A on the jaw arm, one obtains $$MA = F_2 \times d3$$

$$MA' = F_2' \times d3'$$

d3 and d3' being the arms of the moments around the axis A.

In order to open the clamp and to maintain it in the open condition, forces have to be applied to the trigger:

$$Fap = \frac{MA}{da}$$

$$Fap = \frac{MA'}{dA}$$

dA being the length of the arm of the moments around the axis A, of the application forces Fap.

It is seen on FIGS. 4 and 5 that the moment arm d3' of the open clamp is shorter than the arm d3 of the closed clamp, which has the consequence that the force Fap to be applied on the trigger for maintaining the clamp open is considerably smaller than the force for opening it, because the moment MA' is much smaller than the moment MA.

For obtaining this evolution of the arm ratios, the invention proposes as a non-exclusive example, the interposition between the return spring R and the movable jaw 4 of the scaling-down device 16 with two connecting rods as illustrated in the figures. In the illustrated example, by placing the rectilinear connecting rod B2 close to the fixed joint axis A1, the arm d2 of the moment generated by the force $F_2$ may be relatively short. But, by forcing the joint axis A3 to move on a circular arc around the axis A1, by the connecting rod B1, the arm d2 increases during the opening while the length of the arm d1 decreases. Given that in the closed condition of the clamp, the angle between the axes of the connecting rods is relatively small, it is advantageous to give a curved shape to the connecting rod B1 in order to facilitate the movement of the movable joint axis A3 around the fixed axis A1, under the effect of the connecting rod d2.

In order to clearly show the particularity of the invention, allowing to obtain that the force applied to the trigger for maintaining the clamp open is considerably smaller than the applied force for opening it, a non-limiting example of a clamp according to the invention will be given here.

The scaling-down device of this clamp includes an arm B2 with a length of 28 mm between the axes A4 and A3 and a short arm B1, the distance of which, i.e. the straight line, between the axes A1 and A3, is 20 mm. In the closed condition of the clamp, the angle α between the arms B2 and the straight line has a value of 18.36°. In the closed condition of the clamp, the distance between the axes A4 and A2 is 54.4 mm and the angle formed between the straight line connecting the axes A4 and A3 on the one hand and the straight line connecting the axes A4 and A2 on the other hand, is 58°. the distance between the axes A4 and A1 is 11 mm.

By thus producing the scaling-down device, it is obtained that in the closed condition of the clamp, the arm d2 has a length of 6.3 mm and the arm d1 the length of 19.11 mm. For a return force of the spring $F_1$=24 N, a force $F_2$ of 72.81 N is obtained. Due to the positioning indicated above of the joint axes and of the connecting rods, in the open condition of the clamp, the arm d2' has a length of 15.08 mm, and the arm d1' a length of 13.19 mm. In this case, the force of the spring $F_1$' is 46.56 N. A force $F_2$' of 40.72 N results therefrom. The distance between the axes A4 and A2 is now 63 mm and the angle between the lines A4–A2 and A4–A3 is 65°. The distance between the axes A4 and A1 is 20 mm.

Further, for the arms d3 a length of 21.68 mm for the closed clamp and 12.34 mm for the open clamp are obtained. The angle α has in the open condition of the clamp the value of 48.91°.

By using the equations indicated above, with an arm dA of 40.81 mm, the following values are obtained for the force Fap for application on the trigger for the opening and the force Fap' for maintaining the open condition of the clamp.

$$Fap = \frac{MA}{dA} = \frac{F2 \times d2}{dA} = \frac{78.81 \text{ N} \times 21.68 \text{ mm}}{40.81 \text{ mm}} = 38.97 \text{ N}$$

$$Fap' = \frac{MA'}{dA} = \frac{F2' \times d2'}{dA} = \frac{40.72 \text{ N} \times 12.34 \text{ mm}}{40.81 \text{ mm}} = 12.31 \text{ N}$$

It emerges from this practical example based on the principle of the configuration of the connecting rods illustrated in the figures, that the force of 72.81 N for starting the opening of the clamp is greater than the force of 40.72 N for maintaining the clamp open, while ensuring a pressure force for closing both jaws on each other, which has the result that the force of application on the trigger for maintaining the clamp open is much smaller (12.31 N) than the force for opening of the clamp (38.67 N).

Of course, multiple modifications may be made to the clamp as described and illustrated as an example in the figures.

It should be noted that the invention is not limited to ground loop measurement clamps but may be applied to any other clamps having the general structure of the described clamp.

The invention claimed is:

1. A clamp for measuring a ground loop current, the clamp comprising:
   a support;
   a first jaw secured to the support;
   a second jaw pivotally mounted on the support, and movable between a closed position of the clamp in which an end of the second jaw is urged into contact with an end of the first jaw, and an open position of the clamp;
   an elastic element urging the second jaw toward the closed position;
   a lever, including first and second arms, that pivots around an axis on the support, wherein the second jaw is located on the first arm and the second arm forms a trigger for pivoting of the lever between the closed and open positions of the clamp; and
   a device for scaling-down force required for opening the clamp and applied to the trigger, relative to force required for maintaining the second jaw in the open position, wherein
      the device is mounted between the elastic element and the trigger, and
      the device comprises first and second connecting rods, wherein
         the second connecting rod is interposed between the first arm that bears the second law and a first joint axis at a movable end of the elastic element, and
         the first connecting rod is interposed between the first joint axis and a fixed joint axis to force, during opening of the clamp, displacement of the first joint axis on a circular arc around the fixed joint axis, so that a force opposing opening of the second jaw depends on
            return force of the elastic element,
            ratio of length of a third arm of a moment produced by the return force around the fixed joint axis, and
            length of a fourth arm around the fixed axis of a moment of an opposing force, and
         ratio of the lengths of the third and fourth arms decreases during opening of the clamp by the displacement of the first joint axis on the circular arc.

2. The clamp according to claim 1, wherein the second connecting rod is mounted between the movable end of the elastic element and a joint axle that is fixedly mounted on the support.

3. The measurement clamp according to claim 2, wherein the device reduces, upon pivoting of the second jaw into the open position, a moment around the axis on the support and that is produced by the elastic element.

4. The clamp according to claim 3, wherein the device reduces, upon pivoting of the second jaw into the open position, length of an arm of the moment of an opposing force around the axis on the support.

5. The measurement clamp according to claim 3, wherein an application force applied to the trigger around the axis on the support is equal to and opposite the moment of the opposing force around the axis.

6. The clamp according to claim 4, wherein the arm of the moment of the opposing force around the axis on the support decreases upon pivoting of the lever into the open position of the clamp.

7. The clamp according to claim 1, wherein the elastic element is a traction spring.

8. A clamp for measuring a ground loop current, the clamp comprising:
   a support;
   a first jaw secured to the support;
   a lever, including first and second arms, that pivots around an axis on the support,
   a second jaw mounted on the first arm of the lever, wherein the second arm forms a trigger for pivoting of the lever between a closed position of the clamp and an open position of the clamp, and
      in the closed position of the clamp, an end face of the second jaw is urged into contact with an end face of the first jaw, and, in the open position of the clamp, the end face of the second jaw is spaced apart from the end face of the first jaw;
   an elastic element urging the second jaw toward the closed position of the clamp, wherein the elastic element has opposite first and second ends and the first end is pivotally mounted on the support; and
   a structure reducing force applied to the trigger and required to maintain the clamp in the open position, relative to the force required to be applied to the trigger for opening the clamp, from the closed position of the clamp, toward the open position of the clamp, wherein the structure comprises first and second connecting rods, each of the first and second connecting rods has respective first and second ends, the second end of the second connecting rod is pivotally mounted on a first fixed axle that is fixedly mounted on the second arm of the lever the first end of the second connecting rod and the second end of the first connecting rod are commonly pivotally mounted to a movable axle that is coupled to the second end of the elastic element, and the first end of the first connecting rod is pivotally mounted on a second fixed axle that is fixedly mounted on the support, whereby, during opening of the clamp from the closed position toward the open position, the movable axle is displaced along a circular arc centered at the second fixed axle so that a force required to open the clamp from the closed position of the clamp depends on a return force of the elastic element and effective lengths of first and second lever arms defined by respective distances between the second fixed axle and the movable axle, and between the first fixed axle and the movable axle, and is larger than a force required to maintain the clamp in the open position of the clamp.

9. The clamp according to claim 8, wherein the first connecting rod is curved and the second connecting rod is rectilinear.

10. The clamp according to claim 8, wherein the elastic element is a spring.

* * * * *